(12) United States Patent
Dan

(10) Patent No.: US 12,134,145 B2
(45) Date of Patent: Nov. 5, 2024

(54) BRAZING RIBBON AND METHOD FOR MANUFACTURING SAME

(71) Applicant: AMOGREENTECH CO., LTD., Gimpo-si (KR)

(72) Inventor: Sungbaek Dan, Gimpo-si (KR)

(73) Assignee: AMOGREENTECH CO., LTD., Gimpo-si (KR)

( * ) Notice: Subject to any disclaimer, the term of this patent is extended or adjusted under 35 U.S.C. 154(b) by 184 days.

(21) Appl. No.: 17/789,121

(22) PCT Filed: Dec. 22, 2020

(86) PCT No.: PCT/KR2020/018850
§ 371 (c)(1),
(2) Date: Jun. 24, 2022

(87) PCT Pub. No.: WO2021/133019
PCT Pub. Date: Jul. 1, 2021

(65) Prior Publication Data
US 2024/0024989 A1    Jan. 25, 2024

(30) Foreign Application Priority Data

Dec. 27, 2019  (KR) .................. 10-2019-0176290

(51) Int. Cl.
*B23K 35/00*    (2006.01)
*B23K 35/02*    (2006.01)
(Continued)

(52) U.S. Cl.
CPC ...... *B23K 35/0238* (2013.01); *B23K 35/3006* (2013.01); *B23K 35/302* (2013.01); *B23K 35/40* (2013.01)

(58) Field of Classification Search
CPC .. B23K 35/0222–0238; B23K 35/3006; B23K 35/302; B23K 35/40; B23K 35/02;
(Continued)

(56) References Cited

U.S. PATENT DOCUMENTS 3,392,899 A * 7/1968 Hoogstoel ............ C09J 7/20
228/56.3
6,068,176 A * 5/2000 Petrikas ............... B44C 1/1716
228/56.3
(Continued)

FOREIGN PATENT DOCUMENTS

CN    106346168 A  *  1/2017  ............ B23K 35/30
CN    107889559 A  *  4/2018  ............ B32B 15/04
(Continued)

OTHER PUBLICATIONS

KR Office Action dated Dec. 30, 2021 as received in Application No. 10-2019-0176290.

*Primary Examiner* — Kiley S Stoner
(74) *Attorney, Agent, or Firm* — Maschoff Brennan

(57) ABSTRACT

The present invention relates to a brazing ribbon and a method for manufacturing same, and comprises a release film, a seed layer formed on an upper surface of the release film, and a brazing alloy layer formed on an upper surface of the seed layer and is manufactured into a ribbon. The present invention is advantageous in that, since a brazing filler is prepared in advance and then attached to a substrate in the form of a strip, time for attaching the brazing filler can be saved, and the convenience of attaching the brazing filler can be improved.

9 Claims, 4 Drawing Sheets

(51) Int. Cl.
 *B23K 35/30* (2006.01)
 *B23K 35/40* (2006.01)
(58) Field of Classification Search
 CPC ...... B23K 35/30; B23K 35/32; B23K 35/325; B23K 35/262; C23C 14/00
 USPC ........................................ 228/56.3, 245–246
 See application file for complete search history.

(56) References Cited

U.S. PATENT DOCUMENTS

| | | | |
|---|---|---|---|
| 6,875,519 | B2 | 4/2005 | Saeki et al. |
| 2004/0172813 | A1 | 9/2004 | Matsui |
| 2010/0322780 | A1* | 12/2010 | Manier ............... C22C 19/05 228/56.3 |
| 2015/0231740 | A1* | 8/2015 | Grabey ............. B23K 35/0227 228/176 |
| 2015/0329971 | A1 | 11/2015 | Lee et al. |
| 2017/0072514 | A1* | 3/2017 | Ozbaysal ........... B23K 35/0238 |
| 2018/0090414 | A1 | 3/2018 | Dan et al. |

FOREIGN PATENT DOCUMENTS

| | | | | |
|---|---|---|---|---|
| CN | 106356424 B | * | 3/2019 | |
| CN | 112548306 A | * | 3/2021 | |
| CN | 113814602 A | * | 12/2021 | |
| DE | 102006058376 A1 | * | 4/2008 | ............ B23K 35/22 |
| JP | H0725012 U | * | 5/1995 | |
| JP | 2004-207317 A | | 7/2004 | |
| JP | 2016111111 A | * | 6/2016 | |
| KR | 10-2003-0091769 A | | 12/2003 | |
| KR | 10-2014-0057008 A | | 5/2014 | |
| KR | 10-1396919 B1 | | 5/2014 | |
| KR | 20150022357 A | * | 3/2015 | |
| RU | 2741605 C2 | * | 1/2021 | ............ B23K 35/02 |
| TW | 201330301 A | * | 7/2013 | |

* cited by examiner

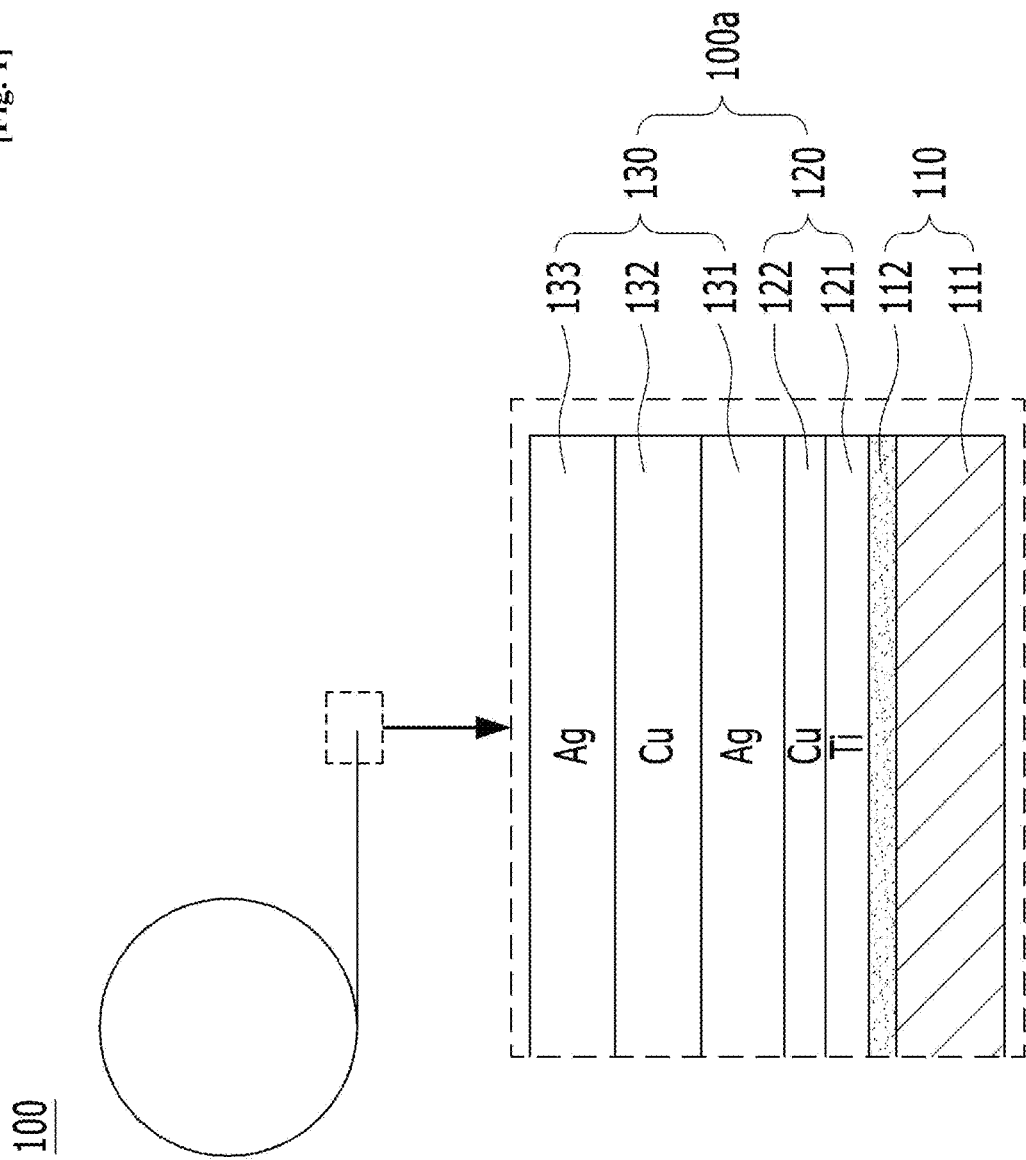

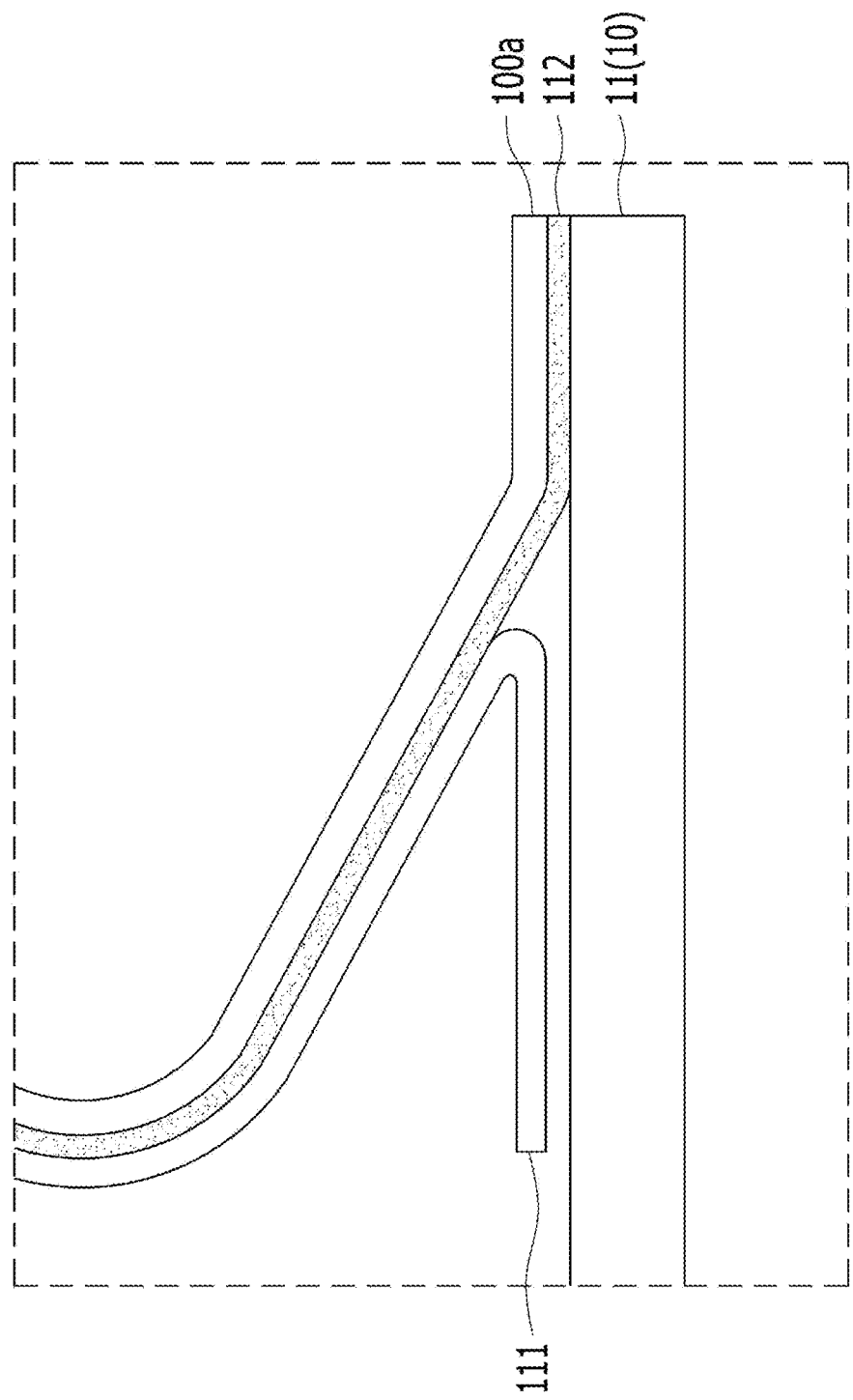

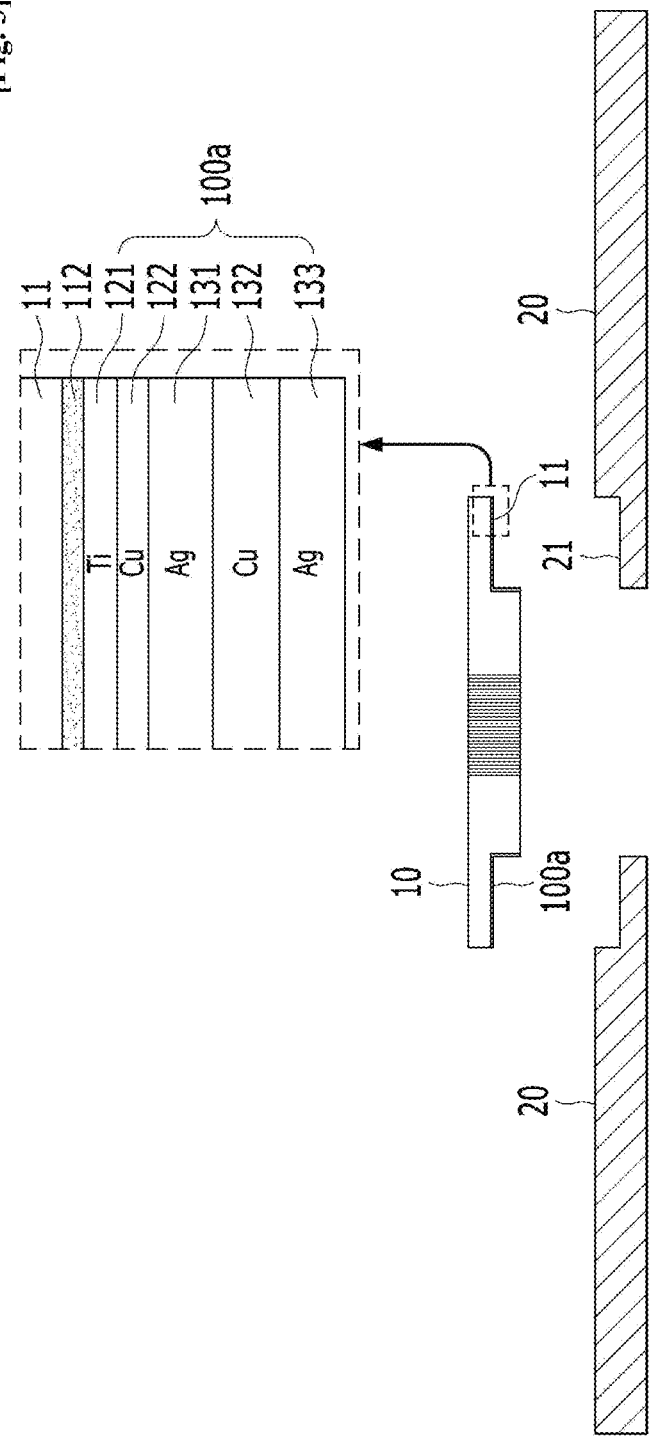

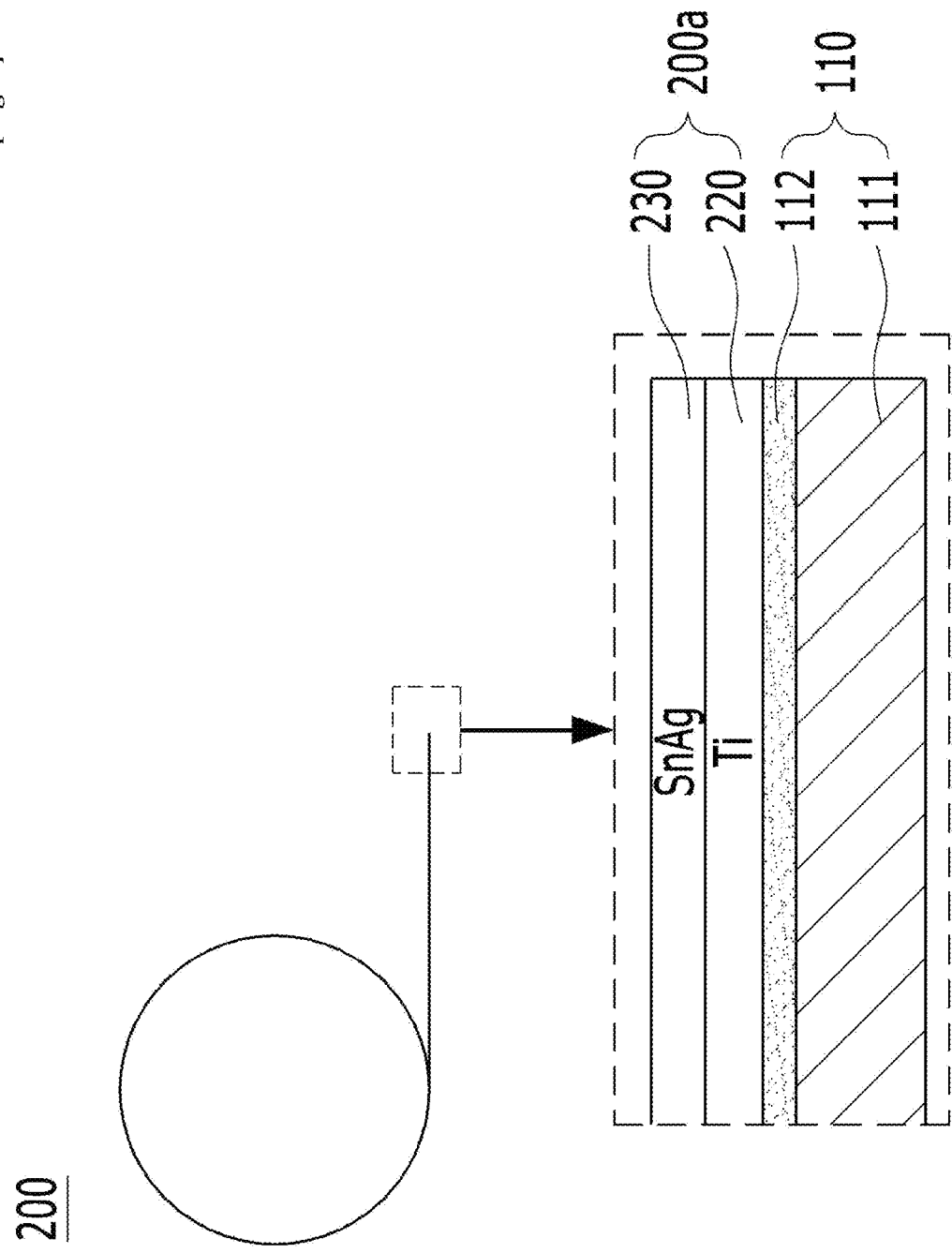

BRAZING RIBBON AND METHOD FOR MANUFACTURING SAME

TECHNICAL FIELD

The present invention relates to a brazing ribbon and a method for manufacturing the same, and more particularly, to a brazing ribbon in which a brazing alloy is manufactured in the form of a sheet and a method for manufacturing the same.

BACKGROUND ART

Brazing is a method of bonding or combining an assembly of two or more materials into one structure. Brazing is accomplished by heating the materials to a temperature less than the solidus temperature of two materials in the presence of braze and optional flux.

In brazing bonding, the two substrates are bonded by attaching a brazing alloy to the bonding surface of at least one of two substrates to be bonded, and heating it, thereby melting the brazing alloy only.

However, in brazing bonding, since the type of the brazing alloy varies depending on the type of substrate, and the brazing alloy is directly formed by performing plating on the bonding surface of the substrate to be bonded, there is a problem of low operation efficiency.

Moreover, when the brazing alloy is formed into a thin film having a multilayer structure, there is a problem in that it takes a lot of time to form a brazing alloy layer on the bonding surface of the substrate.

SUMMARY OF INVENTION

Technical Problem

An object of the present invention is to provide a brazing ribbon capable of increasing the convenience of use and the convenience of the brazing operation by manufacturing a brazing alloy in the form of a sheet and enabling it to be used by attaching it in the form of a strip to a substrate to be brazing-bonded, and a method for manufacturing the same.

Solution to Problem

According to a feature of the present invention for achieving the object as described above, the present invention includes a release film, a seed layer formed on an upper surface of the release film, and a brazing alloy layer formed on an upper surface of the seed layer, and is a ribbon form having a predetermined length.

The seed layer may contain at least one of copper (Cu) and titanium (Ti).

The brazing alloy layer may include an Ag layer and a Cu layer.

The brazing alloy layer may include an Ag layer, a Cu layer formed on an upper surface of the Ag layer, and an Ag layer formed on an upper surface of the Cu layer.

The brazing alloy layer may include a SnAg layer.

It comprises the steps of preparing a release film, forming a seed layer on an upper surface of the release film, forming a brazing alloy layer on an upper surface of the seed layer, and performing blanking to manufacture it into a ribbon.

The step of forming the seed layer may form the seed layer through a sputtering process, and the seed layer may contain at least one of copper (Cu) and titanium (Ti).

The step of forming the brazing alloy layer may form the brazing alloy layer on the upper surface of the seed layer through a plating process, and the brazing alloy layer may include an Ag layer and a Cu layer.

The step of forming the brazing alloy layer may form the brazing alloy layer on the upper surface of the seed layer through a plating process, and the brazing alloy layer may include a SnAg layer.

Advantageous Effects of Invention

The brazing ribbon according to the present invention is manufactured into a ribbon after forming a brazing filler having a multilayer structure on a release film. Since such a brazing ribbon can be used by directly attaching it to a substrate to be brazed, there is an effect of saving time for attaching the brazing filler and improving the convenience of an operation of attaching the brazing filler also.

Moreover, in the present invention, since brazing fillers formed on the release film are produced into various types of brazing fillers for high temperatures and low temperatures, there is an effect that a brazing ribbon suitable for the brazing temperature can be selected and used.

BRIEF DESCRIPTION OF DRAWINGS

FIG. 1 is a view showing a brazing ribbon according to an embodiment of the present invention.

FIG. 2 is a view showing an appearance of attaching the brazing ribbon according to an embodiment of the present invention to a substrate.

FIG. 3 is a view showing a state in which the brazing ribbon according to an embodiment of the present invention is attached to the substrate.

FIG. 4 is a view showing a brazing ribbon according to another embodiment of the present invention.

DESCRIPTION OF EMBODIMENTS

Hereinafter, embodiments of the present invention will be described in detail with reference to the accompanying drawings.

As shown in FIG. 1, the brazing ribbon 100 according to the embodiment of the present invention is manufactured into a ribbon after forming a brazing filler 100a on a release film 110. The ribbon may be provided in a straight form cut to a predetermined length or in a form in which it is wound on a roll. The embodiment shows a brazing ribbon wound on a roll.

The brazing ribbon 100 includes a release film 110, a seed layer 120 formed on an upper surface of the release film 110, and a brazing alloy layer 130 formed on an upper surface of the seed layer 120.

The release film 110 includes a release layer 111 and an adhesive layer 112.

The release layer 111 may include a flexible polymer material, paper, or the like. For example, the release layer 111 may include any one of a polyimide film (PI), a polyester film (PET), and paper, and may include a relatively inexpensive polyester film (PET) as an example. The release layer 111 may have release properties by being coated on the upper surface thereof.

The adhesive layer 112 is formed on the upper surface of the release layer 111. The adhesive layer 112 attaches a brazing filler 100a to the release layer 111. The adhesive layer 112 is formed on the upper surface, which is the coated surface of the release layer 111, and may be easily separated from the release layer 111. The adhesive layer 112 has stronger adhesion to the brazing filler 100a than the release layer 111.

The brazing filler 100a includes a seed layer 120 and a brazing alloy layer 130.

The seed layer 120 is for improving the bonding force between the release film 110 and the brazing alloy layer 130.

The seed layer 120 may contain at least one of copper (Cu) and titanium (Ti). The seed layer 120 may include a first seed layer 121 and a second seed layer 122. In this case, titanium (Ti) may be used as the first seed layer 121, and copper (Cu) may be used as the second seed layer 122.

A primer layer may be included between the release film 110 and the seed layer 120. The primer layer (not shown) is for improving adhesion between the seed layer 120 and the adhesive layer 112.

The brazing alloy layer 130 may be formed as a thin film having a multilayer structure. The thin film having a multilayer structure is intended to increase bonding force by supplementing insufficient performance.

The brazing alloy layer 130 may include Ag layers 131 and 133 and a Cu layer 132. The brazing alloy layer 130 may include an Ag layer 131, a Cu layer 132 formed on an upper surface of the Ag layer 131, and an Ag layer 133 formed on an upper surface of the Cu layer 132. When the brazing alloy layer 130 is formed of an Ag layer-Cu layer-Ag layer, it may be used as a brazing filler for high temperatures 100a. The brazing filler for high temperatures 100a may use titanium (Ti) as the first seed layer 121 and copper (Cu) as the second seed layer 122.

The brazing filler for high temperatures 100a may be applied to brazing bonding of metals having a high melting point. For example, the brazing filler for high temperatures 100a may be used for bonding copper (Cu), which is a metal having a high melting point, and stainless (SUS).

The thickness of the brazing alloy layer 130 may be in a range of 5 μm to 10 μm.

It is preferable that the thickness of the Ag layer and the thickness of the Cu layer have a ratio of 6:4 to 7:3. The ratio of the sum of the Ag layers to the Cu layer in the brazing alloy layer 130 is derived from the composition ratio at the eutectic point where two liquidus lines intersect in the metal binary phase diagram.

The Ti layer 121 may be formed to a thickness of 0.1 μm to 0.2 μm, the Cu layer 122 may be formed to a thickness of 0.2 μm to 0.5 μm, the Ag layer 131 formed on the top of the Cu layer 122 may be formed to a thickness of 1.5 μm, the Cu layer 132 formed on the top of the Ag layer 131 may be formed to a thickness of 1.5 μm, and the Ag layer 133 formed on the top of the Cu layer 132 may be formed to a thickness of 2 μm. This allows the thicknesses of the Ag layers 131 and 133 and the thickness of the Cu layer 132 to have a ratio of 7:3 when the brazing alloy layer 130 is formed to a thickness of 5 μm.

Alternatively, the Ti layer 121 may be formed to a thickness of 0.1 μm to 0.2 μm, the Cu layer 122 may be formed to a thickness of 0.2 μm to 0.5 μm, the Ag layer 131 formed on the top of the Cu layer 122 may be formed to a thickness of 1.5 μm, the Cu layer 132 formed on the top of the Ag layer 131 may be formed to a thickness of 2 μm, and the Ag layer 133 formed on the top of the Cu layer 132 may be formed to a thickness of 1.5 μm. This allows the sum of the thicknesses of the Ag layers 131 and 133 and the thickness of the Cu layer 132 to have a ratio of 6:4 when the brazing alloy layer 130 is formed to a thickness of 5 μm. When the thickness of the brazing alloy layer 130 is changed, the thickness of each thin film constituting the brazing alloy layer 130 may also be changed.

A method for manufacturing a brazing ribbon according to an embodiment of the present invention comprises the steps of preparing a release film, forming a seed layer 120 on an upper surface of the release film 110, forming a brazing alloy layer on an upper surface of the seed layer 120, and performing blanking to manufacture it into a ribbon.

In the step of preparing the release film, a release film 110 in which an adhesive layer 112 is formed on the upper surface of a release layer 111 may be prepared. The release layer 111 may prepare a flexible polymer material. For example, the release layer 111 may prepare any one of a polyimide (PI) film, a polyester (PET) film, and paper.

In the step of forming the seed layer on the upper surface of the release film, the seed layer 120 is formed on the upper surface of the release film 110 through a sputtering process. The seed layer 120 may contain at least one of copper (Cu) and titanium (Ti).

In the step of forming the brazing alloy layer on the upper surface of the seed layer, the brazing alloy layer may be formed on the upper surface of the seed layer through a plating process. The brazing alloy layer may include an Ag layer and a Cu layer. The plating process may use an electroless plating process and an electrolytic plating process. In addition to this, the brazing alloy layer 130 may be formed by an electrospinning or sputtering method.

In the step of performing blanking to manufacture it into a ribbon, the seed layer 120 is formed on the upper surface of the release film 110, and a brazing assembly in which the brazing alloy layer 130 is formed on the upper surface of the seed layer 120 is blanked out to manufacture it into a strip-shaped brazing ribbon. The strip-shaped brazing ribbon may be manufactured in a straight form or a form in which it is wound on a roll.

The manufactured brazing ribbon 100 is attached to the bonding surface 11 of any one of the first substrate 10 and the second substrate 20, and the bonding surfaces 11 and 21 of the first substrate 10 and the second substrate 20 may be used in performing brazing bonding (see FIG. 3).

As shown in FIG. 2, the brazing ribbon 100 may be attached to the bonding surface 11 of the first substrate 10 while peeling the release layer 111. Since the brazing ribbon 100 has a greater strength to which the adhesive layer 112 and the brazing filler 100a are attached than the strength to which the adhesive layer 112 and the release layer 111 are attached, the release layer 111 may be peeled off from the adhesive layer 112, and the adhesive layer 112 may be easily attached to the bonding surface 11 of the first substrate 10.

As shown in FIG. 3, the brazing filler 100a is attached to the bonding surface 11 of the first substrate 10 by the adhesive layer 112. The brazing filler 100a corresponds to the remaining portion in which the release layer 111 is peeled off from the brazing ribbon 100.

In the drawing, the brazing filler 100a attached to the bonding surface 11 of the first substrate 10 includes the first seed layer 121 formed on the lower surface of the adhesive layer 112 and made of a Ti layer, the second seed layer 122 formed on the lower surface of the first seed layer 121 and made of a Cu layer, the Ag layer 131 formed on the lower surface of the second seed layer 122, the Cu layer 132 formed on the lower surface of the Ag layer 131, and the Ag layer 133 formed on the lower surface of the Cu layer 132.

The brazing filler 100a may be attached to the bonding surface 11 of the first substrate 10 and brazing bonding may be performed under high temperature and vacuum conditions in a state in which the brazing filler 100a is abutted against the bonding surface 21 of the second substrate 20.

The brazing filler for high temperatures 100a has a brazing bonding temperature of 850 to 950° C.

The adhesive layer 112 may attach the brazing filler 100a to the bonding surface 11 of the first substrate 10 and may be volatilized at high temperatures during the brazing bonding process.

The brazing ribbon for high temperatures 100 may be used for high-temperature brazing bonding. For example, a brazing ribbon for high temperatures 100 may be attached and used in bonding of a copper plate and a stainless steel plate.

As another embodiment, the brazing alloy layer 230 may include a SnAg layer as shown in FIG. 4. The SnAg layer may be used as a brazing filler for low temperatures 200a. The brazing filler for low temperatures 200a may use titanium (Ti) as the seed layer 220.

The SnAg layer contains 95 to 98% by weight of Sn and 3 to 5% by weight of Ag. Preferably, the SnAg sputter layer consists of 97% by weight of Sn and 3% by weight of Ag.

The Ti layer may be formed to a thickness of 0.2 μm, and the SnAg layer may be formed to a thickness of 1 μm.

The brazing filler for low temperatures 200a may be applied to brazing bonding including a metal or polymer having a low melting point. For example, the brazing filler for low temperatures 200a may be used in bonding of aluminum, which is a metal having a low melting point, and stainless steel, which is a metal having a high melting point.

Specifically, the brazing ribbon 200 used in brazing bonding for low temperatures includes a release film 110, a seed layer 220 formed on an upper surface of the release film 110, and a brazing alloy layer 230 formed on an upper surface of the seed layer 220.

The release film 110 includes a release layer 111 and an adhesive layer 112. A Ti seed layer 220 is formed on the upper surface of the adhesive layer 112, and a SnAg brazing alloy layer 230 is formed on the upper surface of the Ti seed layer 220.

The brazing ribbon 200 used in brazing bonding for low temperatures is manufactured into a ribbon after forming a brazing filler for low temperatures 200a on the release film 110.

The brazing filler for low temperatures 200a includes a Ti seed layer 220 and a SnAg brazing alloy layer 230.

The Ti seed layer 220 is formed on the upper surface of the release film 110 through a sputtering process.

The SnAg brazing alloy layer 230 may be formed on the upper surface of the Ti seed layer 220 through an electroless plating process or an electrolytic plating process. Besides, the SnAg brazing alloy layer 230 may be formed on the upper surface of the Ti seed layer 220 by an electrospinning or sputtering method.

The ribbon may be provided in a straight form cut to a predetermined length or in a form in which it is wound on a roll. Another embodiment shows a brazing ribbon wound on a roll.

The manufactured brazing ribbon for low temperatures 200 is attached to the bonding surface of any one of the first and second substrates, which are two substrates to be bonded, and may be used for low-temperature brazing bonding of the bonding surfaces of the first and second substrates. For example, a brazing ribbon for low temperatures 200 may be attached and used for bonding of an aluminum plate and a stainless steel plate.

Brazing bonding may be performed under low-temperature vacuum conditions in a state in which the brazing filler for low temperatures 200a is attached to the bonding surface of the stainless steel plate, and the bonding surface to which the brazing filler 200a is attached is abutted against the bonding surface of the aluminum plate. The brazing filler for low temperatures 100a has a brazing bonding temperature of 200 to 300° C.

The adhesive layer 112 may attach the brazing filler 200a to the bonding surface 11 of the first substrate 10 and volatilize by heat during the brazing bonding process. Alternatively, after brazing bonding, the adhesive layer 112 may remain or disappear.

The present invention described above has the advantage of attaching a brazing filler formed of a thin film having a multilayer structure of about 10 μm to a release film and manufacturing it into a brazing ribbon, thereby attaching it to a necessary part and enabling it to be used immediately.

The brazing ribbon according to an embodiment of the present invention may be manufactured by varying the types of brazing fillers formed on the release film.

Various types of brazing fillers formed on the release film may be applied in addition to the brazing filler for high temperatures presented in an embodiment and the brazing filler for low temperatures presented in other embodiment.

Since the manufactured brazing ribbon is attached to a substrate to be brazed in the form of a strip, it is unnecessary to perform a process of performing sputtering and plating on the substrate every time brazing is performed. This can reduce the time for attaching the brazing filler to the substrate and improve also the convenience of an operation of attaching the brazing filler.

Optimal embodiments of the present invention have been disclosed in the drawings and the specification. Here, although specific terms have been used, they are used only for the purpose of describing the present invention and are not used to restrict the meaning or limit the scope of the present invention described in the claims. Therefore, it will be understood by those skilled in the art that various modifications and equivalent other embodiments of the present invention are possible therefrom. Accordingly, the true technical scope of the present invention should be defined by the technical spirit of the appended claims.

The invention claimed is:

1. A brazing ribbon including:
   a release film including a release layer and an adhesive layer;
   a seed layer formed on an upper surface of the release film; and
   a brazing alloy layer formed on an upper surface of the seed layer,
   wherein the brazing ribbon has a ribbon form,
   wherein the seed layer is formed on the upper surface of the adhesive layer of the release film, and a primer layer is included for adhesion between the seed layer and the upper surface of the adhesive layer.

2. The brazing ribbon of claim 1, wherein the seed layer contains at least one of copper (Cu) and titanium (Ti).

3. The brazing ribbon of claim 1, wherein the brazing alloy layer includes an Ag layer and a Cu layer.

4. The brazing ribbon of claim 1, wherein the brazing alloy layer includes:
   an Ag layer;
   a Cu layer formed on an upper surface of the Ag layer; and
   an Ag layer formed on an upper surface of the Cu layer.

5. The brazing ribbon of claim 1, wherein the brazing alloy layer includes a SnAg layer.

6. A method for manufacturing a brazing ribbon, the method comprising the steps of:

preparing a release film including a release layer and an adhesive layer;

forming a seed layer on an upper surface of the release film;

forming a brazing alloy layer on an upper surface of the seed layer; and performing blanking to manufacture it into a ribbon, wherein the seed layer is formed on the upper surface of the adhesive layer of the release film, and a primer layer is included for adhesion between the seed layer and the upper surface of the adhesive layer.

7. The method of claim 6, wherein the step of forming of the seed layer forms the seed layer through a sputtering process, and the seed layer contains at least one of copper (Cu) and titanium (Ti).

8. The method of claim 6, wherein the step of forming the brazing alloy layer forms the brazing alloy layer on the upper surface of the seed layer through a plating process, and the brazing alloy layer includes an Ag layer and a Cu layer.

9. The method of claim 6, wherein the step of forming the brazing alloy layer forms the brazing alloy layer on the upper surface of the seed layer through a plating process, and the brazing alloy layer includes a SnAg layer.

* * * * *